(12) United States Patent
Chang et al.

(10) Patent No.: US 10,109,771 B2
(45) Date of Patent: *Oct. 23, 2018

(54) LIGHT EMITTING DEVICE

(71) Applicant: EPISTAR CORPORATION, Hsinchu (TW)

(72) Inventors: Yao-Ru Chang, Hsinchu (TW); Wen-Luh Liao, Hsinchu (TW); Chun-Yu Lin, Hsinchu (TW); Hsin-Chan Chung, Hsinchu (TW); Hung-Ta Cheng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/653,038

(22) Filed: Jul. 18, 2017

(65) Prior Publication Data

US 2017/0317238 A1    Nov. 2, 2017

Related U.S. Application Data

(63) Continuation of application No. 15/410,441, filed on Jan. 19, 2017, now Pat. No. 9,748,443, which is a continuation-in-part of application No. 14/949,414, filed on Nov. 23, 2015, now Pat. No. 9,590,143, which is a continuation of application No. (Continued)

(30) Foreign Application Priority Data

Jul. 30, 2013 (TW) .............................. 102127373 A

(51) Int. Cl.
*H01L 33/00* (2010.01)
*H01L 33/44* (2010.01)
*H01L 33/38* (2010.01)
*H01L 33/22* (2010.01)
*H01L 33/20* (2010.01)
*H01L 33/08* (2010.01)

(52) U.S. Cl.
CPC .............. *H01L 33/44* (2013.01); *H01L 33/38* (2013.01); *H01L 33/08* (2013.01); *H01L 33/20* (2013.01); *H01L 33/22* (2013.01)

(58) Field of Classification Search
CPC ......... H01L 33/18; H01L 33/20; H01L 33/22; H01L 33/38; H01L 33/44; H01L 33/54; H01L 33/60; H01L 33/62; H01L 33/85
USPC ..................................................... 257/91–99
See application file for complete search history.

(56) References Cited

U.S. PATENT DOCUMENTS

| 7,341,879 B2 | 3/2008 | Yen et al. | |
| 9,196,806 B2 * | 11/2015 | Lin | H01L 33/38 |
| 9,748,443 B2 * | 8/2017 | Chang | H01L 33/305 |

(Continued)

FOREIGN PATENT DOCUMENTS

WO    2012177316 A1    12/2012

*Primary Examiner* — Brook Kebede
(74) *Attorney, Agent, or Firm* — Ditthavong & Steiner, P.C.

(57) ABSTRACT

The present disclosure provides a light-emitting device, comprising: a light-emitting stack; a first semiconductor layer on the light-emitting stack; a first electrode formed on the first semiconductor layer and comprising an inner segment, an outer segment, and a plurality of extending segments electrically connecting the inner segment with the outer segment.

20 Claims, 12 Drawing Sheets

Related U.S. Application Data

14/050,707, filed on Oct. 10, 2013, now Pat. No. 9,196,806.

(60) Provisional application No. 61/802,792, filed on Mar. 18, 2013.

(56) References Cited

U.S. PATENT DOCUMENTS

| | | |
|---|---|---|
| 2011/0089444 A1 | 4/2011 | Yao et al. |
| 2011/0316017 A1 | 12/2011 | Liu et al. |
| 2013/0049038 A1* | 2/2013 | Jeong .................. H01L 27/153 |
| | | 257/91 |
| 2013/0107534 A1 | 5/2013 | Avramescu et al. |
| 2014/0264411 A1 | 9/2014 | Lin et al. |

* cited by examiner

LIGHT EMITTING DEVICE

REFERENCE TO RELATED APPLICATION

This application is a continuation application of a previously filed U.S. patent application Ser. No. 15/410,441 filed on Jan. 19, 2017, entitled as "LIGHT EMITTING DEVICE", which is a continuation-in-part of a previously filed U.S. patent application Ser. No. 14/949,414 filed on Nov. 23, 2015, entitled as "LIGHT EMITTING DEVICE", which claims the right of priority based on U.S. provisional application Ser. No. 61/802,792, filed on Mar. 18, 2013, and the right of priority based on TW application Serial No. 102127373, filed on Jul. 30, 2013. The entire contents of each of these applications are hereby incorporated by reference.

BACKGROUND

Technical Field

The present disclosure relates to a light-emitting device, and in particular to a light-emitting device comprising a light-absorbing layer.

Description of the Related Art

The light-emitting diodes (LEDs) of the solid-state lighting elements have the characteristics of low power consumption, low heat generation, long operational life, shockproof, small volume, quick response and good opto-electrical property like light emission with a stable wavelength so the LEDs have been widely used in household appliances, indicator light of instruments, and opto-electrical products, etc.

A light-emitting diode usually comprises a light-emitting stack and two electrodes provided for injecting a current into the light-emitting stack for emit light. In general, two electrodes are design to have a current spreading throughout the light-emitting stack such that a light-emitting area configured to emit light is substantially the same as the surface area of the light-emitting stack. However, in other application, there is a need for a light-emitting having a limited light-emitting area with a high current density for improving light efficiency thereat.

SUMMARY OF THE DISCLOSURE

The present disclosure provides a light-emitting device.

The light-emitting device comprises: a light-emitting stack; a first semiconductor layer on the light-emitting stack; a first electrode formed on the first semiconductor layer and comprising an inner segment, an outer segment, and a plurality of extending segments electrically connecting the inner segment with the outer segment.

BRIEF DESCRIPTION OF THE DRAWING

The accompanying drawing is included to provide easy understanding of the application, and is incorporated herein and constitutes a part of this specification. The drawing illustrates the embodiment of the application and, together with the description, serves to illustrate the principles of the application.

DETAILED DESCRIPTION OF THE EMBODIMENTS

Figure 1:
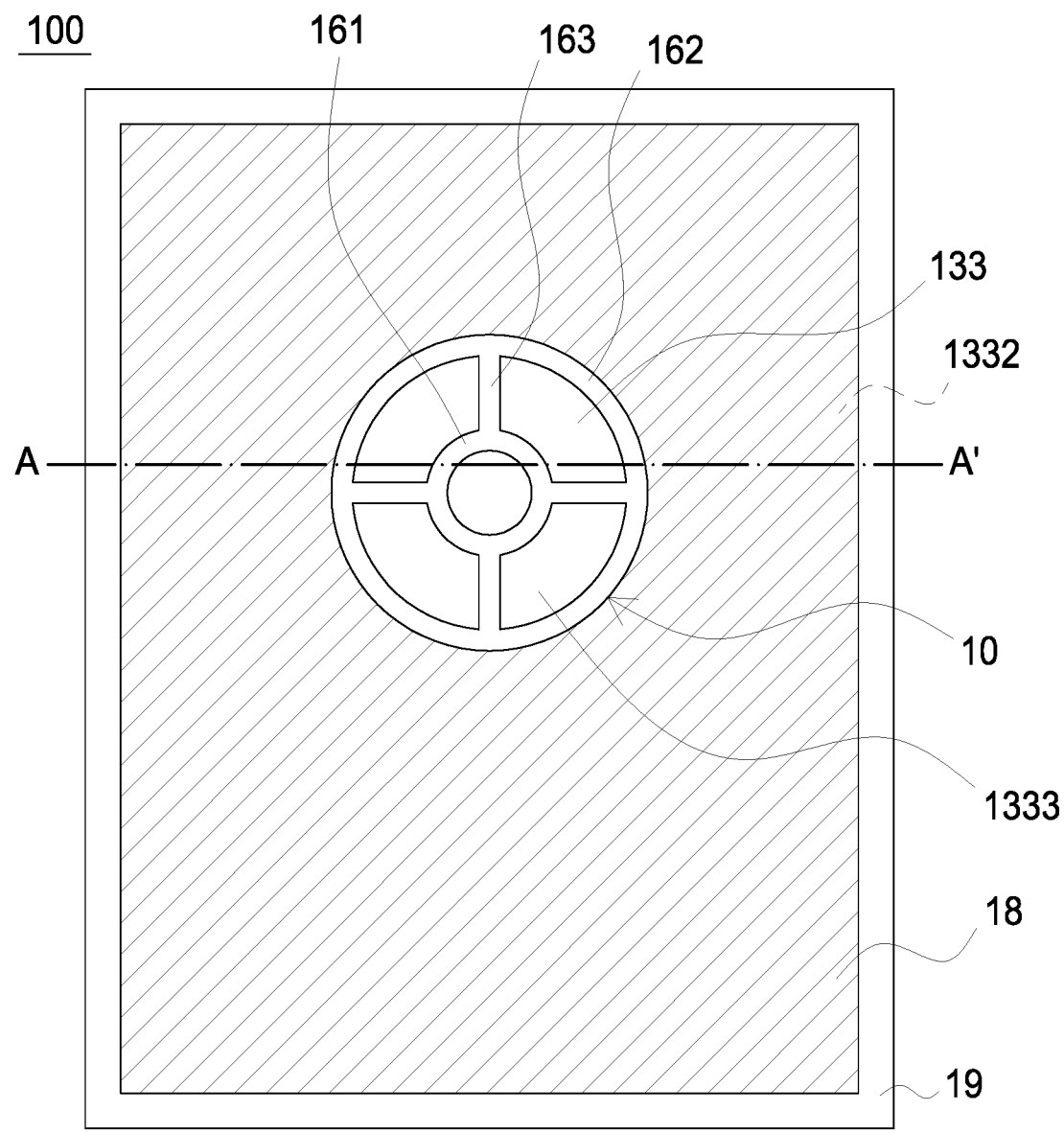
FIG. 1 shows a top view of a light-emitting device in accordance with the first embodiment of the present disclosure.

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure in accordance with the drawing.

Figure 2:
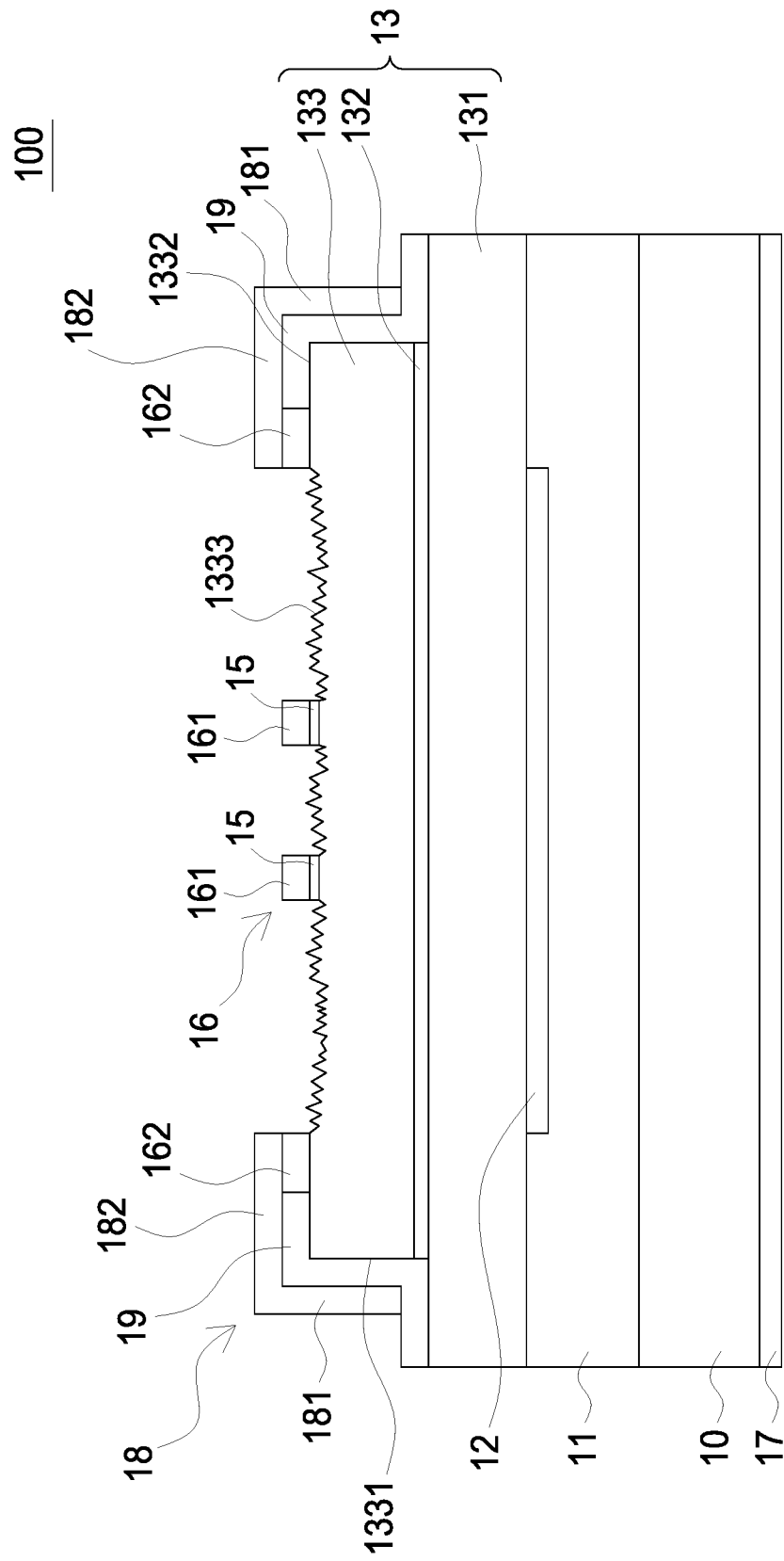
FIG. 2 shows a cross-sectional view of the light-emitting device, taken along line AA' of FIG. 1.

FIGS. 1 and 2 disclose a light-emitting device 100 in accordance with the first embodiment of the present disclosure. FIG. 1 shows the top view of the light-emitting device 100 and FIG. 2 shows the cross-sectional view of the light-emitting device 100. The light-emitting device 100 comprises a substrate 10, a light-emitting stack 13 formed on the substrate 10, a reflective layer 12 formed between the substrate 10 and the light-emitting stack 13, and a bonding layer 11 formed between the reflective layer 12 and the substrate 10. The light-emitting stack 13 comprises a first-type conductivity semiconductor layer 131, a second-type conductivity semiconductor layer 133, and an active layer 132 sandwiched between the first-type and second-type conductivity semiconductor layers 131, 133. The first-type and second-type conductivity semiconductor layers 131, 133 respectively provide electrons and holes such that electrons and holes can be combined in the active layer 132 to emit light when a current is applied thereto. The material of the light-emitting stack 13 comprises III-V group semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. Depending on the material of the active layer 132, the light-emitting stack 13 is capable of emitting a red light with a wavelength in a range from 610 nm to 650 nm, a green light with a wavelength in a range from 530 nm to 570 nm, a blue light with a wavelength in a range from 450 nm to 490 nm or a UV light with a wavelength in a range from 400 nm-450 nm. A method of making the light-emitting stack 13 is not limited to but comprises Metal-organic Chemical Vapor Deposition (MOCVD), Molecular Beam Epitaxy (MBE), Hydride Vapor Phase Epitaxy (HVPE), evaporation or ion electroplating. The light-emitting device 100 further comprises a first electrode 16 formed on the second-type conductivity semiconductor layer 133, a second electrode 17 formed on the substrate 10, a light-absorbing layer 18 formed on a portion of the first electrode 16, and an insulation layer 19 formed between the light-absorbing layer 18 and the second-type conductivity semiconductor layer 133. In this embodiment, the first electrode 16 is patterned and comprises an inner segment 161, an outer segment 162, and a plurality of extending segments 163 electrically connected the inner segment 161 with the outer segment 162. As shown in FIG. 2, the light-emitting device 100 further comprises an ohmic contact layer 15 formed between the inner segment 161 and the light-emitting stack 13 for providing an ohmic contact path therebetween. The ohmic contact layer 15 has a shape substantially equal to that of the inner segment 161. The ohmic contact layer 15 is not formed between the outer segment 162 and the light-emitting stack 13. Alternatively, the ohmic contact layer 15 can be formed between the outer segment 162 and the light-emitting stack 13, and has a shape substantially equal to that of the outer segment 162 (not shown). The inner segment 161 and the outer segment 162 comprise a circle, rectangle, quadrangle or polygon in shape. When the inner segment 161 and the outer segment 162 are a circle in shape, they are concentric.

Referring to FIG. 2, the second-type conductivity semiconductor layer 133 of the light-emitting stack 13 has a side wall 1331 and a top surface. The top surface has a first region 1332 and a second region 1333. The second region 1333 is defined by the outer segment 162 formed on the first region 1332 such that the first region 1332 surrounds the second region 1333. Specifically, the outer segment of the first region 1332 surrounds the second region 1333. The inner segment 161 is formed on a portion of the second region 1333 without covering the entire second region 1333 so a partial second-type conductivity semiconductor layer 133 is exposed for the light emitted from the active layer 132 to pass outside the light-emitting device 100 therethrough. The exposed second region 1333 where there is no inner segment 161 disposed can be roughed by etching such as dry etching or wetting etching for improving light extraction. The light-absorbing layer 18 has a first portion 181 surrounding the side wall 1331 and a second portion 182 above the first region 1332 of the top surface of the light-emitting stack 13. Specifically, the insulation layer 19 and the outer segment 162 is formed on and covering the first region 1332 of the top surface of the second-type conductivity semiconductor layer 133 and the second portion 182 of the light-absorbing layer 18 is formed on and covering the insulation layer 19 and the outer segment 162. In addition, the insulation layer 19 covers the side wall 1331 of the light-emitting stack 13 and the first portion 181 covers a side wall of the insulation layer 19. Since the ohmic contact layer 15 is merely formed between the inner segment 161 and the light-emitting stack 13, the active layer 132 below the inner segment 161 (that is, the second region) emits light such that a first quantity of the light (more than 90%) directly passes outside the light-emitting device 100 through the second region 1333 and a second quantity of the light (less than 10%) may emit toward the light-absorbing layer 18 which is configured to absorb light. In one embodiment, more than 50% of the second quantity of the light is absorbed by the light-absorbing layer 18. In addition, the light emitted from the active layer 132 does not pass outside the light-emitting device 100 through the first region 1332 and the side wall 1331. A ratio of an area of the second region 1333 to an area of the top surface of the light-emitting stack 13 is between 10%-90%, that is, a light-emitting area is defined as 10%-90% of the area of the light-emitting stack 13. The light-absorbing layer 18 can comprise a single layer or a plurality of sublayers and has a thickness larger than 300 Å. The light-absorbing layer 18 comprises titanium (Ti), chromium (Cr), nickel (Ni), Au, or combinations thereof. The first electrode 16 comprises metal or metal alloy. The metal comprises Cu, Al, Au, La, or Ag. The metal alloy comprises La, Ge—Au, Be—Au, Cr—Au, Ag—Ti, Cu—Sn, Cu—Zn, Cu—Cd, Sn—Pb—Sb, Sn—Pb—Zn, Ni—Sn, or Ni—Co. The light-absorbing layer 18 can comprise a bonding pad for wire bonding to an external structure (not shown), for example, a submount, and therefore forming an electrical connection therebetween when in operation.

In this embodiment, the reflective layer 12 is embedded within the bonding layer 11 in a position corresponding to the second region 1333 of the top surface of the light-emitting stack 13. Accordingly, when the light emitted from the active layer 132 emits toward the substrate 10, the light can be reflected by the reflective layer in opposite direction toward the second-type conductivity semiconductor layer 133. Since some of the light only passes outside through the second region 1333 of the top surface of the second-type conductivity semiconductor layer 133, the reflective layer 12 has an area substantially equal to that of the second region 1333 of the top surface of the light-emitting stack 13. In other embodiment, the reflective layer 12 can have an area substantially larger than that of the second region 1333 of the top surface of the light-emitting stack 13.

Figure 3:
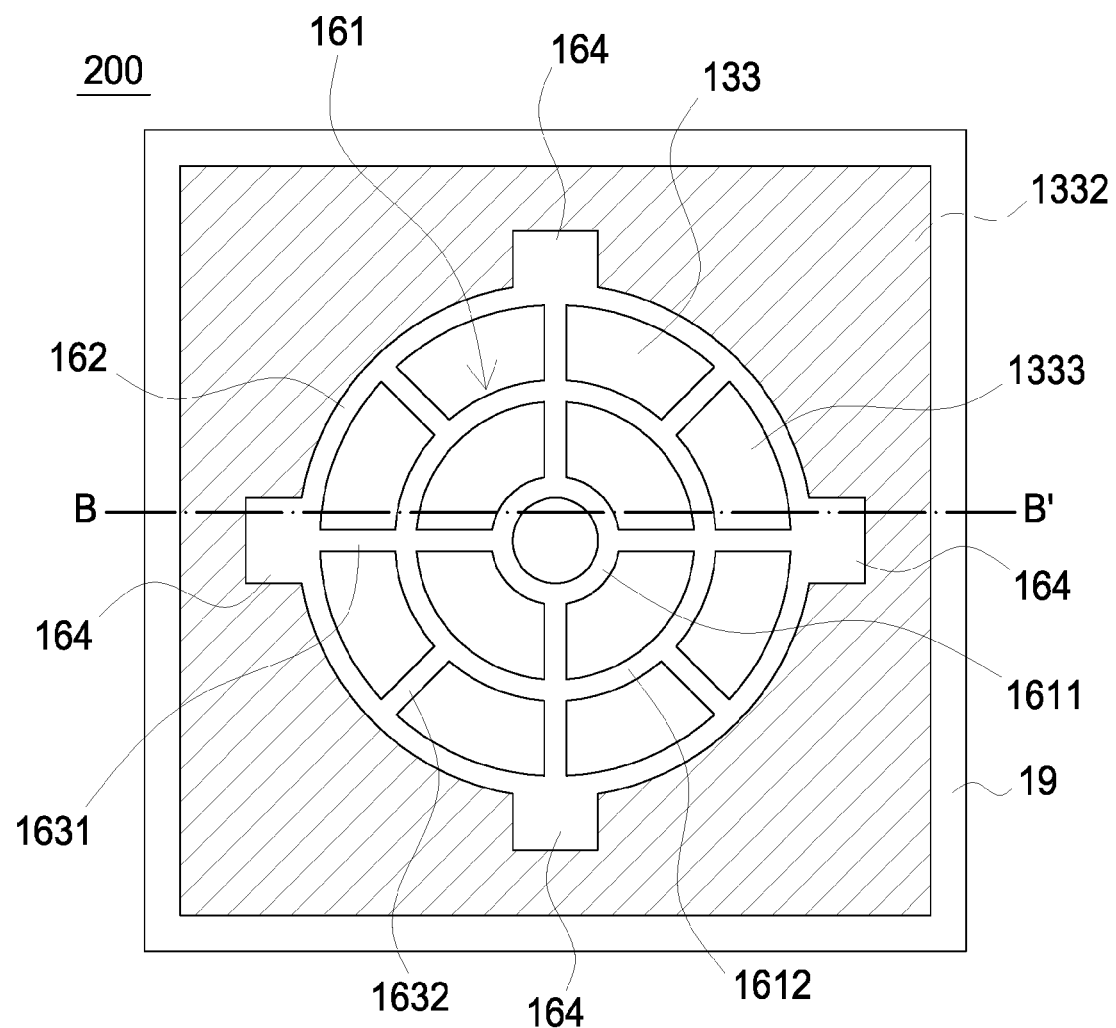
FIG. 3 shows a top view of a light-emitting device in accordance with the second embodiment of the present disclosure.
Figure 4:
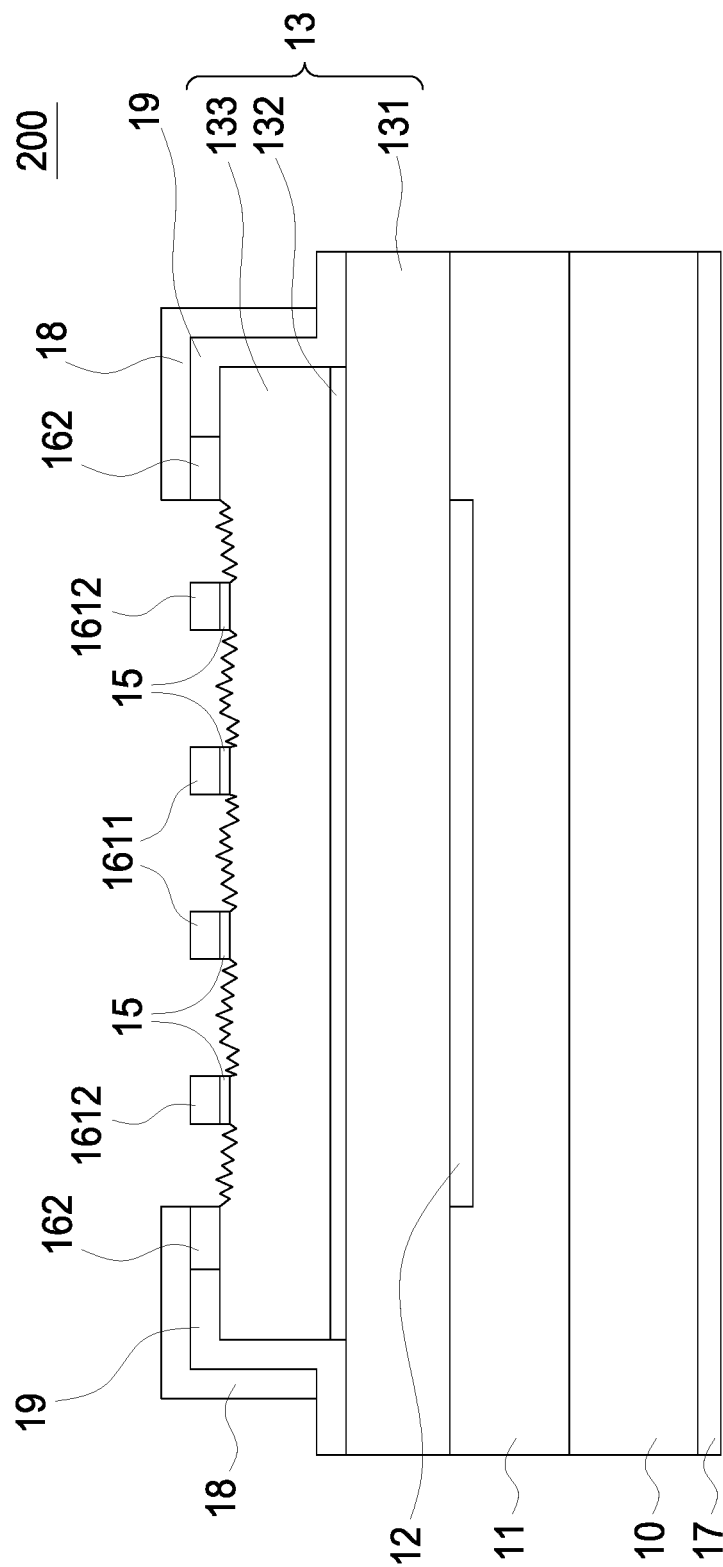
FIG. 4 shows a cross-sectional view of the light-emitting device, taken along line BB' of FIG. 3.

FIGS. 3 and 4 disclose a light-emitting device 200 in accordance with the second embodiment of the present disclosure. FIG. 3 shows the top view of the light-emitting device 200 and FIG. 4 shows the cross-sectional view of the light-emitting device 200. The light-emitting device 200 has the similar structure with the first embodiment of the light-emitting device 100 except that the inner segment 161 has two inner sub-segments 1611, 1612. A plurality of first extending segment 1631 electrically connects the two inner sub-segments 1611, 1612 with the outer segment 162 and a plurality of second extending segments 1632 electrically connects one of the two inner sub-segments 1611, 1612 with the outer segment 162. The first extending segment 1631 and the second extending segments 1632 are alternately arranged. The outer segment 162 comprises a plurality of protrusions 164. The outer segment 162 and the protrusions 164 are provided for defining the second region 1333 where the light emitted from the active layer 132 merely passes outside the light-emitting device 200 therethrough. As shown in FIG. 4, the ohmic contact layer 15 is formed between the two inner sub-segments 1611, 1612 and the light-emitting stack 13 for providing an ohmic contact path therebetween. The ohmic contact layer 15 has a shape substantially same as that of the two inner sub-segments 1611, 1612 of the inner segment 161. The ohmic contact layer 15 is not formed between the outer segment 162 and the light-emitting stack 13. Alternatively, the ohmic contact layer 15 can be formed between the outer segment 162 and the light-emitting stack 13, and has a shape substantially same as that of the outer segment 162. The inner two sub-segments 1611, 1612 of the inner segment 161 and the outer segment 162 comprise a circle, rectangle, quadrangle or polygon in shape. When the two inner sub-segments 1611, 1612 of the inner segment 161 and the outer segment 162 are a circle in shape, they are concentric. A ratio of an area of the second region 1333 to an area of the top surface of the light-emitting stack 13 is between 10%-90%. It is noted that numbers of the inner segment and the outer segments can be varied depending on the actual requirements. The larger the desired area of the second region where the light emitted from the active layer passes outside the light-emitting device therethrough, the more numbers of the inner segment and the outer segments are.

Figure 5A:
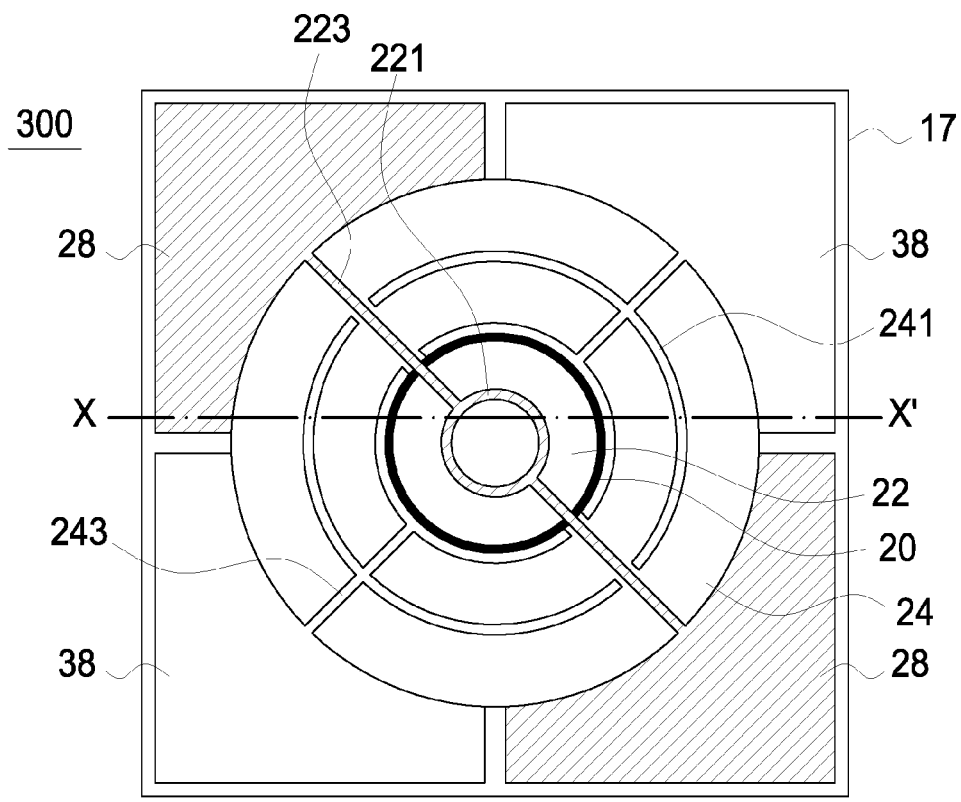
FIG. 5A shows a top view of a light-emitting device in accordance with the third embodiment of the present disclosure.
Figure 5B:
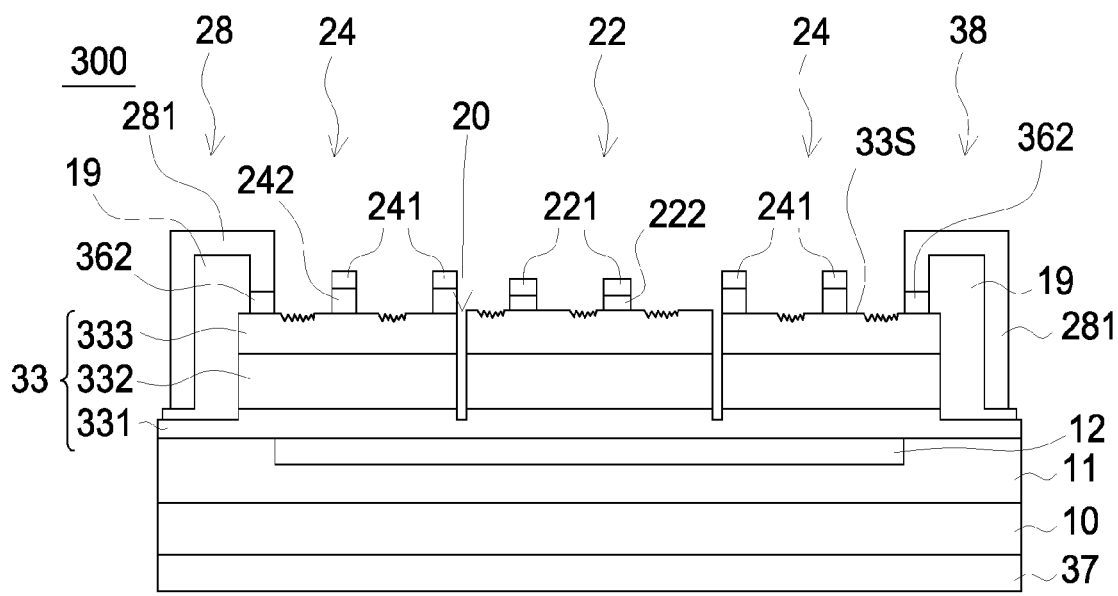
FIG. 5B shows a cross-sectional view of the light-emitting device, taken along line XX' of FIG. 5A.

FIGS. 5A and 5B disclose a light-emitting device 300 in accordance with the third embodiment of the present disclosure. FIG. 5A is a top view of the third embodiment. FIG. 5A shows a cross-sectional view of the light-emitting device, taken along line XX' of FIG. 5A. As shown in FIG. 5A, the light-emitting device 300 comprises a light-emitting area and an electrode area surrounding the light-emitting area. The light-emitting area is substantially arranged in a center of the light-emitting device 300. The electrode area is a light-absorbing area, or a non-light-emitting area. The light-emitting area has a shape of circle in top view. It is noted that the shape is not limited and can be polygon, such as triangle or square. Assuming the shape of the light-emitting area is a circle, its diameter is between 0.004-0.5 mm. In one embodiment, the diameter is between 0.001-0.2 mm. The light-emitting device 300 has a structure similar to the light-emitting device 100 of the first embodiment, except that the light-emitting device 300 comprises a trench 20 for separating an epitaxial structure 33 into a first semiconductor structure 22 and a second semiconductor structure 24. The first semiconductor structure 22 has a shape of circle in top view and the second semiconductor structure 24 surrounds the first semiconductor structure 22. The first semiconductor structure 22 and the second semiconductor structure 24 have substantially the same epitaxial structure 33 and have the same material composition and the same stacking structure. The epitaxial structure 33 comprises a first-type conductivity semiconductor layer 331, a second-type conductivity semiconductor layer 333, and an active layer 332 disposed between the first-type conductivity semiconductor layer 331 and a second-type conductivity semiconductor layer 333. The trench 20 separates the active layer 332 and the second-type conductivity semiconductor layer 333 of the first semiconductor structure 22 from the active layer 332 and the second-type conductivity semiconductor layer 333 of the second semiconductor structure 24. However, the first-type conductivity semiconductor layer 331 of the first semiconductor structure 22 and the first-type conductivity semiconductor layer 331 of the second semiconductor structure 24 are physically connected with each other. When the first semiconductor structure 22 is driven by a current, the active layer 332 of the first semiconductor structure 22 can emit a first light with a first main wavelength; and when the second semiconductor structure 24 is driven by a current, the active layer 332 of the second semiconductor structure 24 can emit a second light with a second main wavelength. The first main wavelength and the second main wavelength are within the same wavelength range. The first main wavelength and the second main wavelength have the same wavelength, for example, a red light having a wavelength of 610 nm-650 nm, a green light having a wavelength of 530 nm-570 nm, or a blue light having a wavelength of 450 nm-490 nm. In another embodiment, the first main wavelength can be different from the second main wavelength.

In order to avoid the first light from the active layer 332 of the first semiconductor structure 22 being emitted toward the second semiconductor structure 24, the trench 20 comprises one or more insulation layer. The insulation layer comprises an insulation material for absorbing the first light or reflecting the first light. The insulation material comprises an organic polymer material or inorganic material.

A reflective layer 12 of the light-emitting device 300 overlaying portions of the first semiconductor structure 22 is physically connected with the reflective layer 12 overlaying portions of second semiconductor structure 24. In a top view, the reflective layer 12 is configured to arrange at a position corresponding to the light-emitting area, and the reflective layer 12 has an area substantially equal to or larger than that of the light-emitting area. When the first light and/or the second light from the active layer 332 emits toward the substrate 10, the first light and/or the second light can be reflected toward the second-type conductivity semiconductor layer 333 and escape outward at a side near to the second-type conductivity semiconductor layer 333. Specifically, all the first light and/or the second light substantially emit outward from a top surface 33S of the light-emitting device 300. In one embodiment, the top surface 33S comprises a rough surface formed by etching or imprinting for improving the light extraction of the light-emitting device 300.

As shown in FIG. 5A, the electrode area comprises a plurality of external electrode structure. The plurality of external electrode structure substantially surrounds the second semiconductor structure 24 and comprises a first external electrode structure 28 and a second external electrode structure 38. Each of the first external electrode structure 28 and the second external electrode structure 38 can be a bonding pad for wire bonding to an external structure (not shown), for example, a submount, and therefore forming an electrical connection therebetween when driven by a current. The first external electrode structure 28 and a second external electrode structure 38 respectively comprise an insulation layer 19 and a conductive layer 281. The insulation layer 19 is disposed between the second semiconductor structure 24 and the conductive layer 281. A material of the conductive layer 281 comprises metal or metal alloy. The metal comprises La, Cu, Al, Au, or Ag. The metal alloy comprises GeAu, BeAu, CrAu, AgTi, CuSn, CuZn, CuCd, Sn—Pb—Sb, Sn—Pb—Zn, NiSn, or NiCo.

As shown in FIG. 5A, there are a pair of the first external electrode structure 28 and a pair of the second external electrode structure 38. The pair of the first external electrode structure 28 is disposed at opposite positions and facing each other and the pair of the second external electrode structure 38 is disposed at opposite positions and facing each other. In this embodiment, the first external electrode structure 28 and the second external electrode structure 38 are alternately arranged. In other embodiment, a number and an arrangement of the first external electrode structure 28 and the second external electrode structure 38 can be varied but not be limited to above description.

As shown in FIGS. 5A and 5B, the light-emitting device 300 comprises a plurality of extension electrode on the epitaxial structure 33. Specifically, the plurality of extension electrode comprises a first extension electrode 221 disposed on the first semiconductor structure 22 and a second extension electrode 241 disposed on the second semiconductor structure 24. The first extension electrode 221 or the second extension electrode 241 comprises a circular shape. However, a number and a shape of the first extension electrode 221 and the second extension electrode 241 can be designed to enhance current spreading.

As shown in FIG. 5A, the light-emitting device 300 comprises a first connecting electrode 223 connecting the first extension electrode 221 to the first external structure 28, and a second connecting electrode 243 connecting the second extension electrode 241 to the second external structure 38.

In one embodiment, the light-emitting device 300 can comprise an ohmic contact layer at a position corresponding to the extension electrode, for example among the first extension electrode 221, the second extension electrode 241 and the epitaxial structure 33. As shown in FIG. 5B, the light-emitting device 300 comprises a first ohmic contact layer 222 disposed between the first extension electrode 221 and the second-type conductivity semiconductor layer 333, and a second ohmic contact layer 242 disposed between the second extension electrode 241 and the second-type conductivity semiconductor layer 333. In another embodiment, the light-emitting device 300 can comprise an ohmic contact layer 362 disposed between the conductive layer 281 of the first external electrode structure 28 and the second-type conductivity semiconductor layer 333, and/or between the conductive layer 281 of the second external electrode structure 38 and the second-type conductivity semiconductor layer 333. The ohmic contact layers 222, 242 have the shape as substantially the same as the first and second extension electrodes 221, 241, respectively. By virtue of the ohmic contact layers 222, 242, 362, a contact resistance between the extension electrode and the second-type conductivity semiconductor layer 333 and a contact resistance between the conductive layer 281 and the second-type conductivity semiconductor layer 333 can be reduced.

As shown in FIG. 5B, the light-emitting device 300 comprises a lower electrode 37 formed on the substrate 10. The lower electrode 37 and the first external electrode structure 28 (or the second external electrode structure 38) are formed on opposite sides of the substrate 10, thereby forming the light-emitting device 300 with a vertical-type. In addition, since the first-type conductivity semiconductor layer 331 of the first semiconductor structure 22 and the first-type conductivity semiconductor layer 331 of the second semiconductor structure 24 are physically connected with each other, the lower electrode 37 can electrically connect with the first-type conductivity semiconductor layer 331 of the first semiconductor structure 22 and with the first-type conductivity semiconductor layer 331 of the second semiconductor structure 24 such that the first semiconductor structure 22 and the second semiconductor structure 24 can be synchronously driven when in operation. The substrate 10 is a conductive substrate and comprises a semiconductor material or a metal material.

As shown in FIG. 5A, the first external electrode structure 28 of the electrode area can function as a first electrode set cooperated with the lower electrode 37 for receiving a first current to form a current passage therebetween such that the first semiconductor structure 22 is driven to emit the first light with a first illumination; the second external electrode structure 38 different from the first electrode set can function as a second electrode set for receiving a second current to drive the second semiconductor structure 24 to emit the second light with a second illumination. The first illumination and the second illumination can be adjustable by the first current and the second current, or by a size of the first semiconductor structure 22 and the second semiconductor structure 24, for example, the area of the active layer of the first semiconductor structure 22 and the active layer of second semiconductor structure 24. When the area of the active layer of the first semiconductor structure 22 is smaller than the area of the active layer of second semiconductor structure 24, and a value of the first current is equal to that of the second current (the current density of the first semiconductor structure 22 is greater than that of the second semiconductor structure 24), the first illumination is greater than the second illumination. When the area of the active layer of the first semiconductor structure 22 is equal to the area of the active layer of second semiconductor structure 24 and a value of the first current is greater than that of the second current (the current density of the first semiconductor structure 22 is greater than that of the second semiconductor structure 24), the first illumination is greater than the second illumination.

Figure 6:
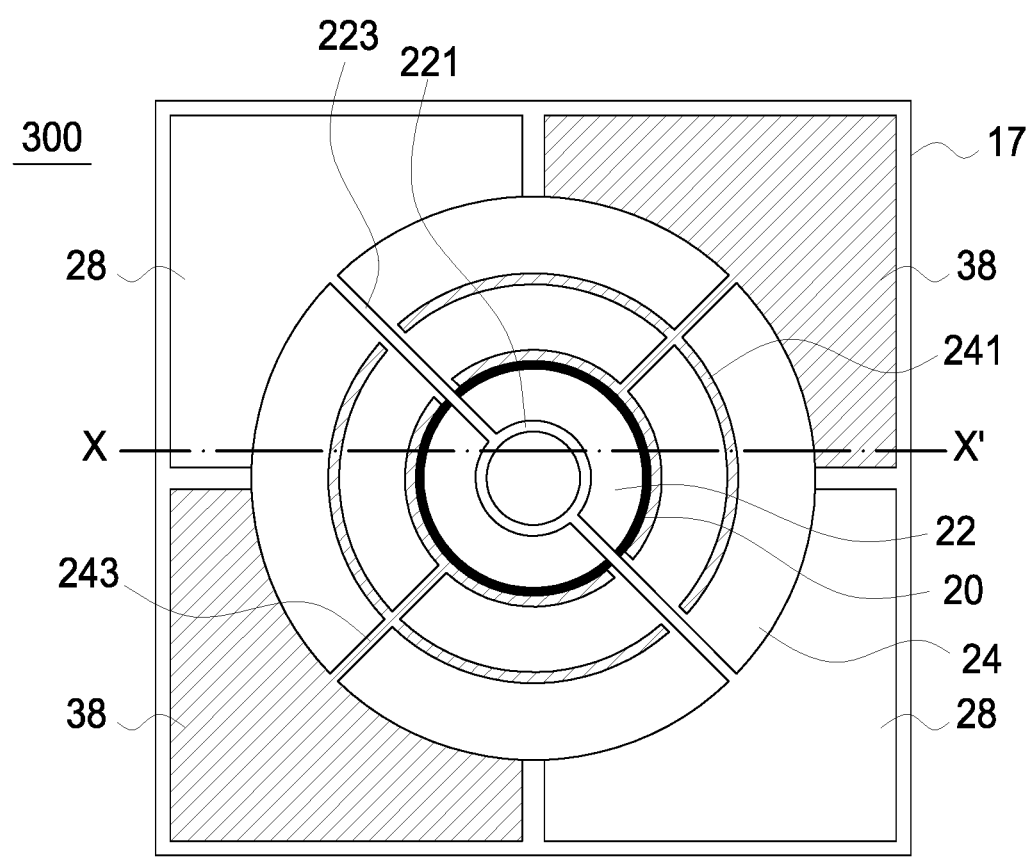
FIG. 6 shows a top view of a light-emitting device in accordance with the third embodiment of the present disclosure.
Figure 7:
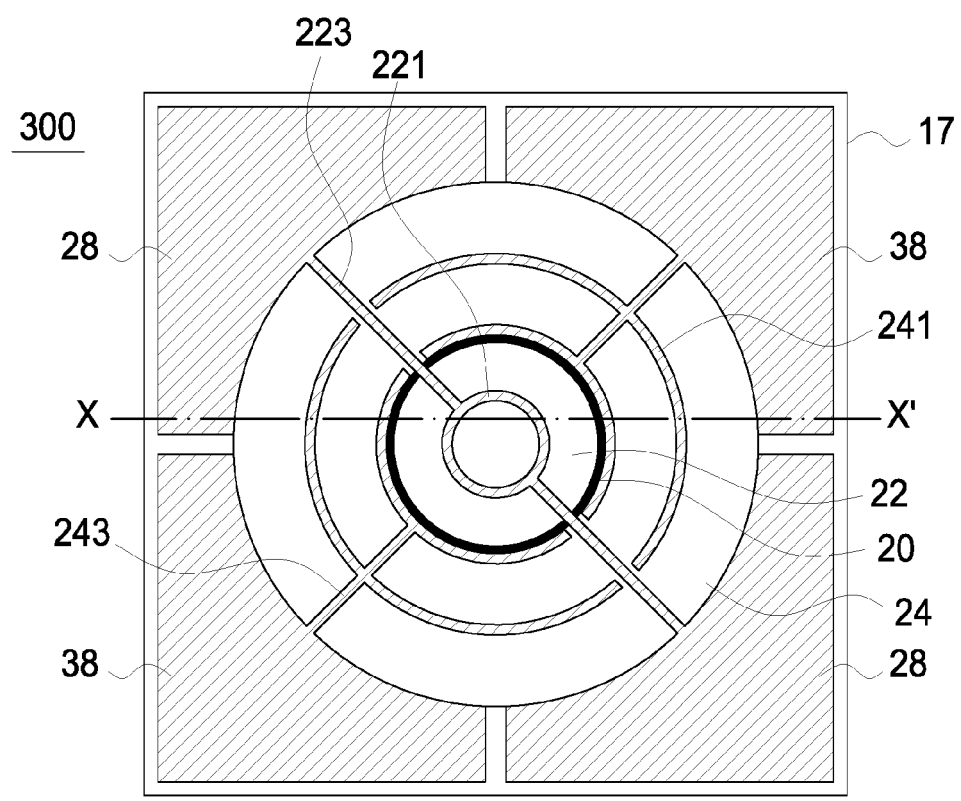
FIG. 7 shows a top view of a light-emitting device in accordance with the third embodiment of the present disclosure.

The first electrode set and the second electrode set can separately and simultaneously receive a current. As shown in FIG. 5A, when only the first electrode set, i.e. the first external electrode structure 28 receives the first current, the first semiconductor structure 22 is driven to emit the first light. As shown in FIG. 6, when only the second electrode set, i.e. the second external electrode structure 38 receives the second current, the second semiconductor structure 24 is driven to emit the second light. As shown in FIG. 7, when the first electrode and the second electrode set, i.e. the first external electrode structure 28 and the second external electrode structure 38 separately receive the first current and the second current at the same time, the first semiconductor structure 22 and the second semiconductor structure 24 are driven to simultaneously emit the first light and the second light.

Figure 8:
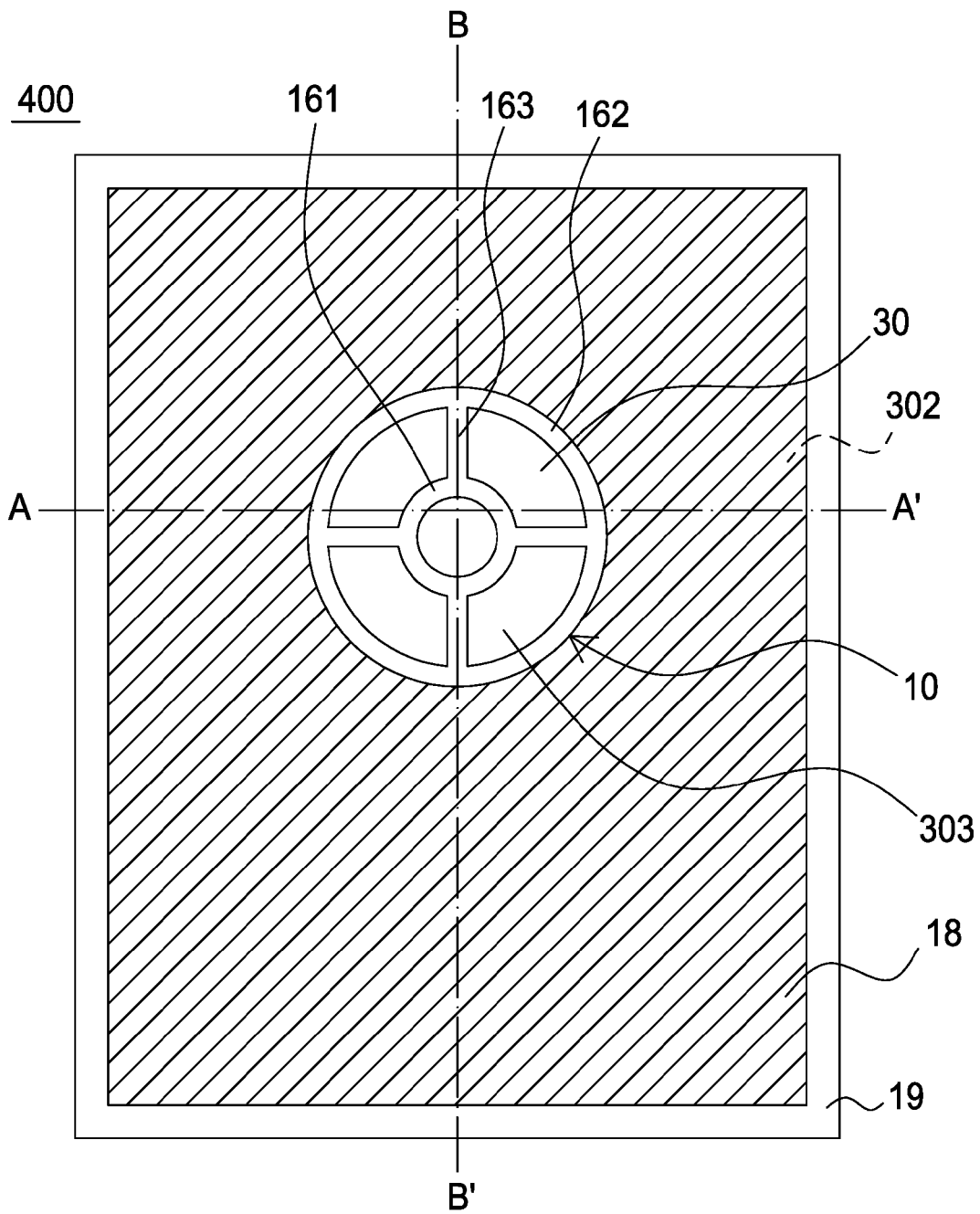
FIG. 8 shows a top view of a light-emitting device in accordance with the fourth embodiment of the present disclosure.
Figure 9:
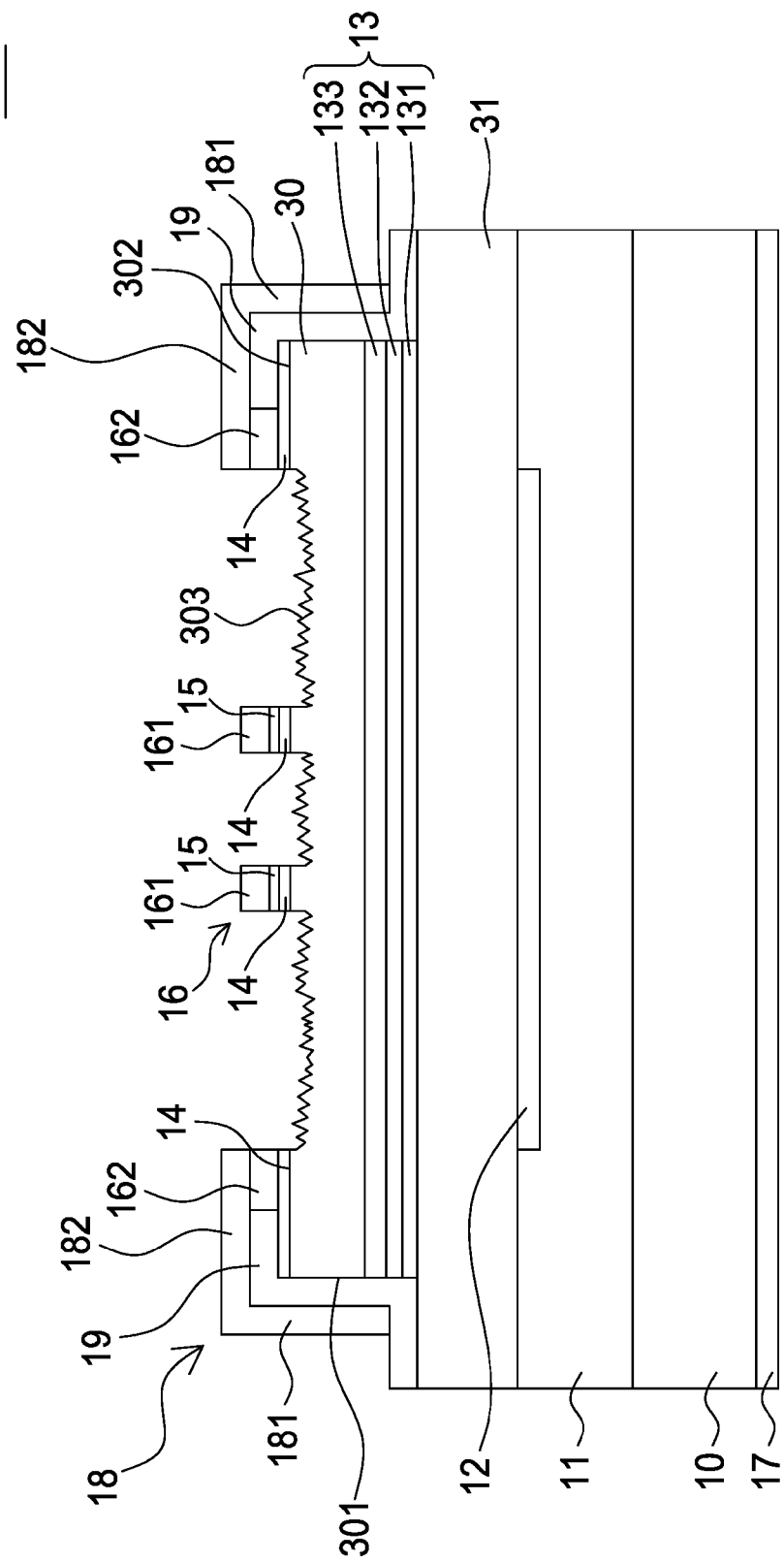
FIG. 9 is a cross-sectional view along an A-A' line shown in FIG. 8 after a step of roughing.
Figure 10:
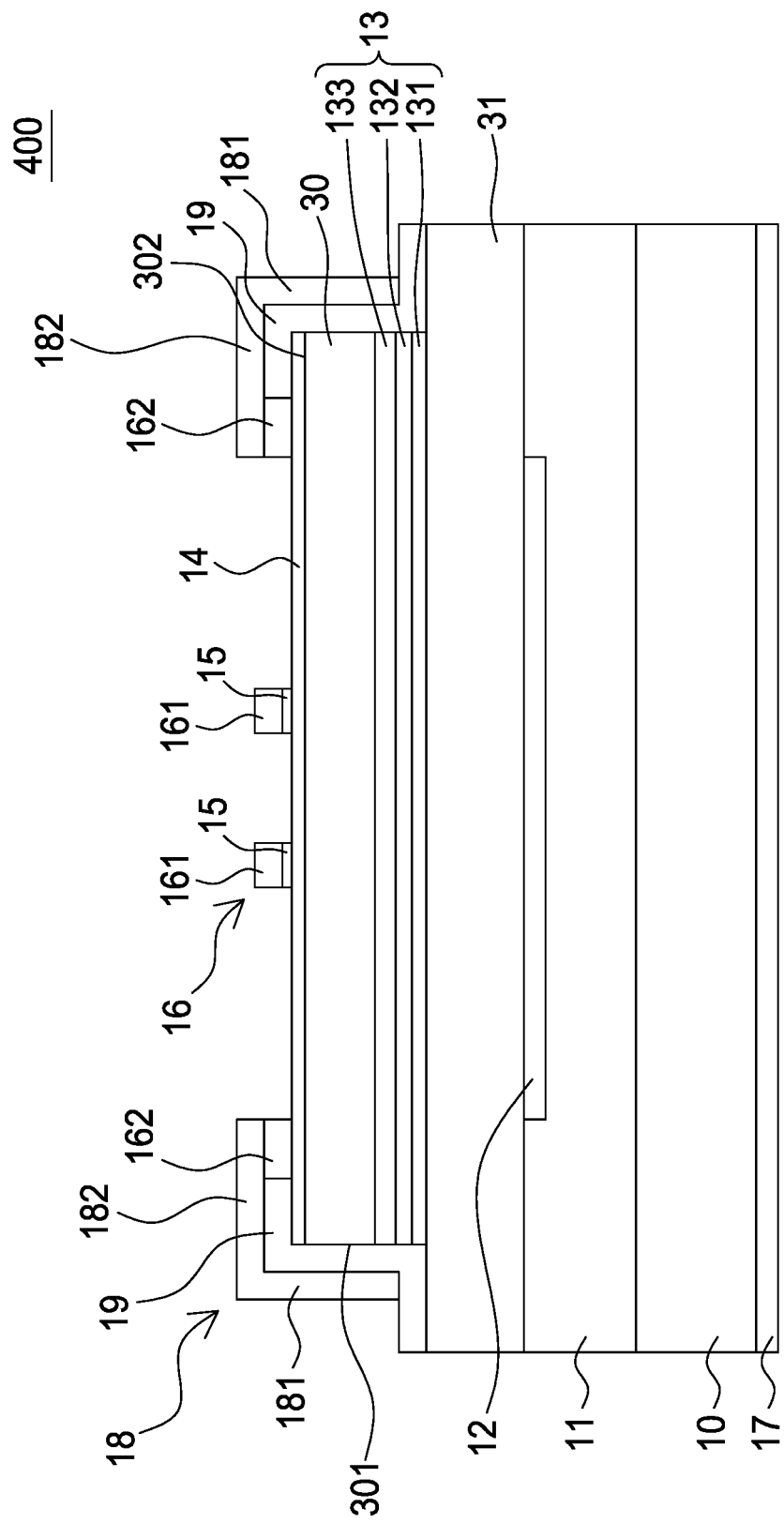
FIG. 10 is a cross-sectional view along an A-A' line shown in FIG. 8 before the step of roughing.
Figure 11:
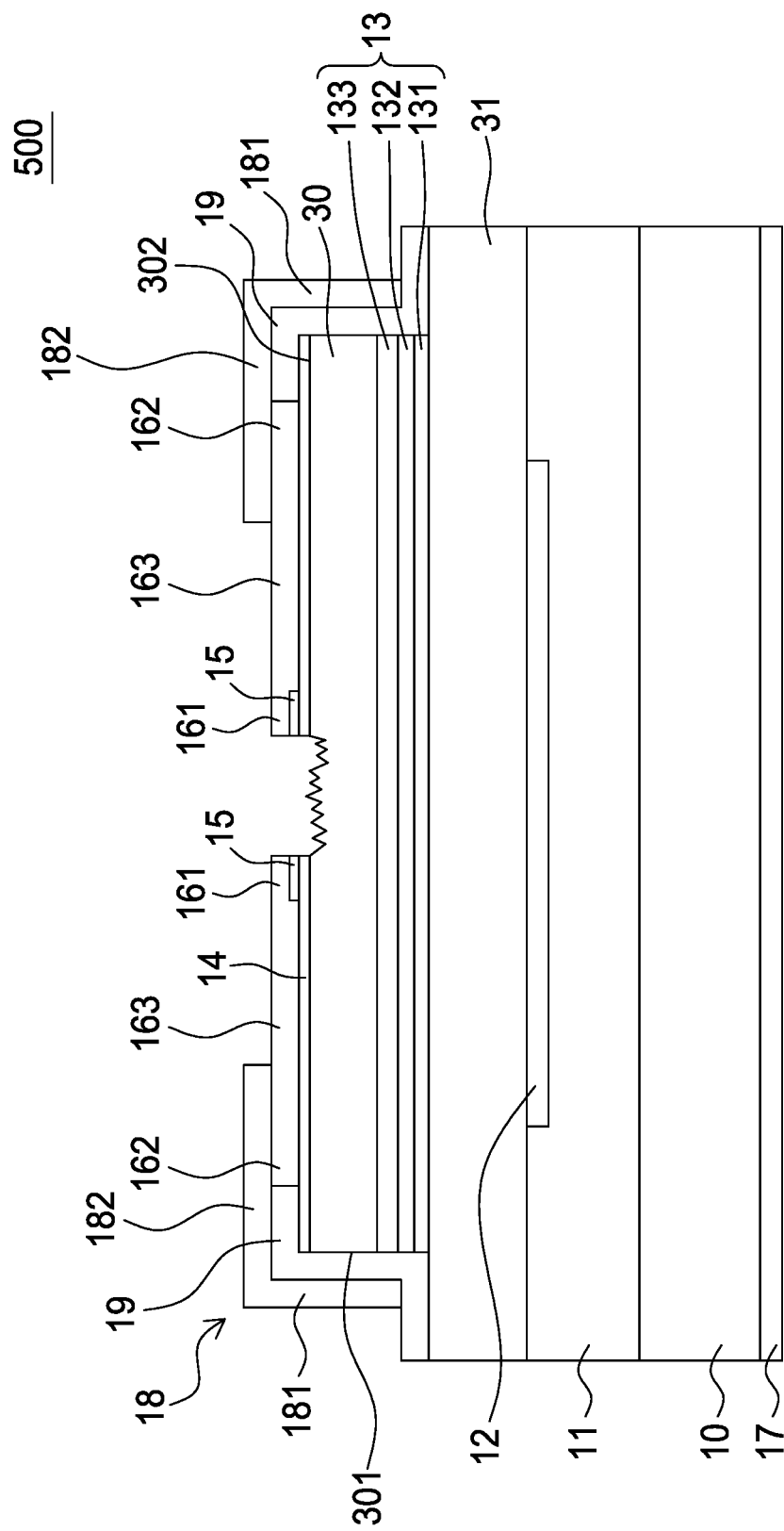
FIG. 11 is a cross-sectional view along a B-B' line shown in FIG. 8.

FIGS. 8 through 11 disclose a light-emitting device 400 in accordance with the fourth embodiment of the present disclosure. FIG. 8 shows a top view of a light-emitting device in accordance with the fourth embodiment of the present disclosure. FIG. 9 is a cross-sectional view along an A-A' line shown in FIG. 8 after a step of roughing. FIG. 10 is a cross-sectional view along an A-A' line shown in FIG. 8 before the step of roughing. FIG. 11 is a cross-sectional view along a B-B' line shown in FIG. 8. The light-emitting device 400 has the similar structure with the first embodiment of the light-emitting device 100. The difference is that the light-emitting device 400 further comprises a first semiconductor layer 30, a second semiconductor layer 14, and a third semiconductor layer 31. The first semiconductor layer 30 is between the first electrode 16 and the light-emitting stack 13. The second semiconductor layer 14 is between the first electrode 16 and the first semiconductor layer 30. The third semiconductor layer 31 is between the bonding layer 11 and the light-emitting stack 13. Referring to FIG. 10, after forming the light-absorbing layer 18 on the second semiconductor layer 14, a part of the second semiconductor layer 14 is not covered by the light-absorbing layer 18 and the first electrode 16. Thus the part is exposed. A roughing step is performed to remove the exposed part of the second semiconductor layer 14 so as to rough a part of a top surface of the first semiconductor layer 30. After the roughing step, the light-emitting device 400 as shown in FIG. 9 is obtained, wherein the first semiconductor layer 30 comprises substantially the same surface structure as that of the second-type conductivity semiconductor layer 133 in the foregoing embodiment as shown in FIG. 2. In the present embodiment, the first semiconductor layer 30 has a side wall 301 and a top surface. The top surface comprises a first region 302 and a second region 303. The second region 303 is defined by the light-absorbing layer 18 formed on the first region 302, which means the first region 302 surrounds the second region 303. The outer segment 162 of the first electrode 16 on the first region 302 surrounds the second region 303. The inner segment 161 of the first electrode 16 is formed on a portion of the second region 303 without covering the entire second region 303. As a result, a part of the first semiconductor layer 30 is exposed such that the light emitted from the active layer 132 can pass outside the light-emitting device 100.

In the present embodiment, the first semiconductor layer 30 has a maximum thickness greater than a thickness of the second-type conductivity semiconductor layer 133. In the present embodiment, the first semiconductor layer 30 has a maximum thickness determined from first region 302 to the bottom of the first semiconductor layer 30. In one embodiment, the maximum thickness of the first semiconductor layer 30 is not less than 500 nm, and preferably, not less than 1000 nm, and more preferably, between 1500 and 4000 nm both inclusive for improving current spreading through the light-emitting stack 13 and/or improving the extraction efficiency. The first semiconductor layer 30 is substantially transparent to the light emitted from the active layer.

In one embodiment, the first semiconductor layer 30 has a conductivity type the same as that of the second-type conductivity semiconductor layer 133. In one embodiment, the first semiconductor layer 30 is an n-type semiconductor. The first semiconductor layer 30 has a doping concentration of a dopant greater than that of the second-type conductivity semiconductor layer 133 for improving current spreading through the light-emitting stack 13. In one embodiment, the doping concentration of the dopant of the first semiconductor layer 30 is not less than $1 \times 10^{17}/cm^3$, and preferably, between $5 \times 10^{17}/cm^3$ and $5 \times 10^{18}/cm^3$ both inclusive. The first semiconductor layer 30 has an energy gap less than that of the second-type conductivity semiconductor layer 133. In one embodiment, the first semiconductor layer 30 comprises a Group III-V semiconductor material, such as $(Al_yGa_{(1-y)})_{1-x}In_xP$, wherein $0 \le x \le 1$, $0 \le y \le 1$ or $Al_xGa_{(1-x)}As$, wherein $0 \le x \le 1$. In one embodiment, the dopant can be an n-type dopant or a p-type dopant. In one embodiment, the n-type dopant is Te, or Si. The p-type dopant is C or Mg.

After the roughing step, the second semiconductor layer 14 has a pattern substantially the same as the pattern of the first electrode 16. As shown in FIG. 9, a part of the second semiconductor layer 14 is between the ohmic contact layer 15 and the first semiconductor layer 30, and the other part of the second semiconductor layer 14 is between the first semiconductor layer 30 and the outer segment 162, and specifically, between the first region 302 of the first semiconductor layer 30 and the outer segment 162. As a result, the part of the second semiconductor layer 14 between the first semiconductor layer 30 and the outer segment 162 is directly in contact with the outer segment 162. Specifically, an outer edge of the second semiconductor layer 14 and the side wall 301 of the first semiconductor layer 30 are substantially coplanar. In addition, as shown in FIG. 9, the second portion of the light-absorbing layer 18 overlaps a first part of the second semiconductor layer 14, and the ohmic contact layer 15 overlaps a second part of the second semiconductor layer 14 without overlapping the first part of the second semiconductor layer 14. Specifically, the first electrode 16 is directly in contact with the ohmic contact layer 15 and the second semiconductor layer 14 both. More specifically, referring to FIG. 11, the outer segment 162 of the first electrode 16 and the a plurality of extending segments 163 are directly in contact with the second semiconductor layer 14, and the inner segment 161 of the first electrode 16 is directly in contact with ohmic contact layer 15. In the present embodiment, the second semiconductor layer 14 comprises a Group III-V semiconductor material. Preferably, the second semiconductor layer 14 comprises a Group III-V semiconductor material comprising an element different from that of the ohmic contact layer 15, and the element is the same as one of the elements of the first semiconductor layer 30. The second semiconductor layer 14 is for lowering the difference between two different material systems, such as lowering the difference between the material of the first semiconductor layer 30 and the material of the ohmic contact layer 15. Preferably, the second semiconductor layer 14 comprises a Group III-V semiconductor material that is devoid of Al so as to prevent or decrease the formation of byproduct such as native oxide; thus improving the adhesion between the second semiconductor layer 14 and the outer segment 162. In one embodiment, the second semiconductor layer 14 comprises $In_aGa_{1-a}P$, wherein $0 \le a \le 1$, the ohmic contact layer 15 comprises $Al_bGa_{(1-b)}As$, wherein $0 \le b \le 1$, and the first semiconductor layer 30 comprises a $(Al_yGa_{(1-y)})_{1-x}In_xP$, wherein $0 \le x \le 1$, $0 \le y \le 1$.

In one embodiment, the second semiconductor layer 14 has a doping concentration of a dopant less than a doping concentration of a dopant of the ohmic contact layer 15. Preferably, a ratio of the doping concentration of the ohmic contact layer 15 to the doping concentration of the second semiconductor layer 14 is not less than 2, and preferably, between 5 and 15 both inclusive, so as to prevent or decrease the current directly flowing through the part of the second semiconductor layer 14 between the first semiconductor layer 30 and the outer segment 162 and to increase the amount of current flowing through the ohmic contact layer 15. As a result, the output power of light is improved due to a higher current density in the second region 303, which is a main light extraction area. In one embodiment, the doping concentration of the dopant of the second semiconductor layer 14 is not greater than $1 \times 10^{18}/cm^3$, preferably, not greater than $9 \times 10^{17}/cm^3$, and more preferably, between $1 \times 10^{17}/cm^3$ and $7 \times 10^{17}/cm^3$ both inclusive. In one embodiment, the dopant can be an n-type dopant or a p-type dopant. In one embodiment, the n-type dopant is Te, or Si. The p-type dopant is C or Mg. In one embodiment, the second semiconductor layer 14 has a thickness less than the maximum thickness of the first semiconductor layer 30, and preferably, less than a thickness of the ohmic contact layer 15. In one embodiment, the second semiconductor layer 14 has a thickness not less than 5 nm, and preferably between 5 nm and 50 nm both inclusive.

In one embodiment, the third semiconductor layer 31 has a thickness greater than a thickness of the first-type conductivity semiconductor layer 131. In one embodiment, the third semiconductor layer 31 has a maximum thickness not less than 500 nm, and preferably, not less than 1000 nm, and more preferably, between 1500 and 4000 nm. In addition, the third semiconductor layer 31 has a thickness less than the maximum thickness of the first semiconductor layer 30. The third semiconductor layer 31 has a conductivity type the same as that of the first-type conductivity semiconductor layer 131. In one embodiment, the third semiconductor layer 31 is a p-type semiconductor. The third semiconductor layer 31 has a doping concentration of a dopant greater than that of the first-type conductivity semiconductor layer 131 for improving current spreading through the light-emitting stack 13. In one embodiment, the doping concentration of the dopant of the third semiconductor layer 31 is not less than $10^{17}/cm^3$, and preferably, between $5 \times 10^{17}/cm^3$ and $5 \times 10^{18}/cm^3$ both inclusive. The third semiconductor layer 31 has an energy gap less than that of the first-type conductivity semiconductor layer 131. In one embodiment, the third semiconductor layer 31 comprises a Group III-V semiconductor material, such as $(Al_yGa_{(1-y)})_{1-x}In_xP$, wherein $0 \le x \le 1$, $0 \le y \le 1$ or $Al_xGa_{(1-x)}As$, wherein $0 \le x \le 1$. In one embodiment, the dopant can be an n-type dopant or a p-type dopant. In one embodiment, the n-type dopant is Te, or Si. The p-type dopant is C or Mg.

Figure 12:
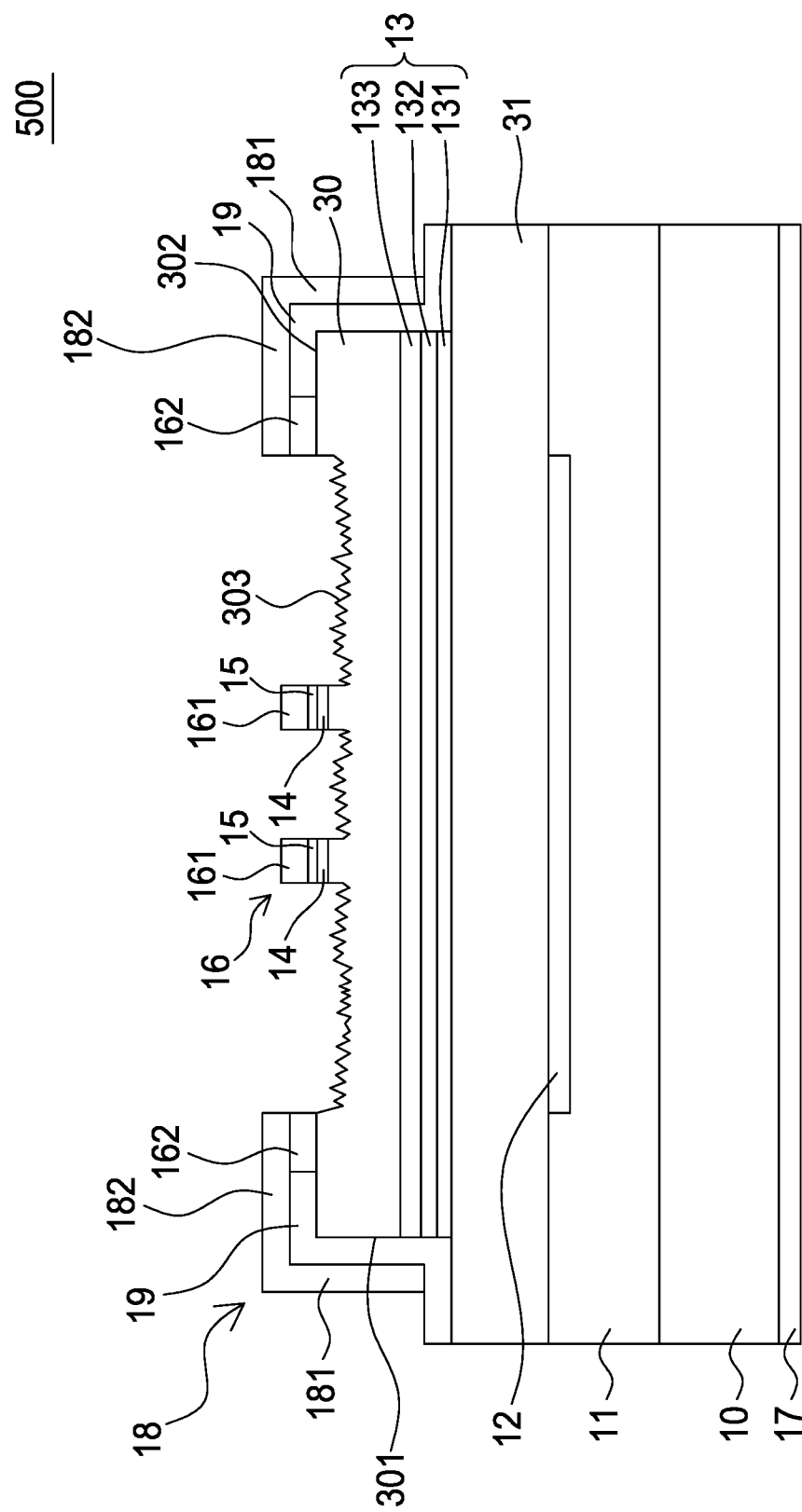
FIG. 12 disclose a light-emitting device 500 in accordance with the fifth embodiment of the present disclosure.

FIG. 12 disclose a light-emitting device 500 in accordance with the fifth embodiment of the present disclosure. The top view of the light-emitting device 500 is substantially the same as the top view shown in FIG. 8. FIG. 12 is a cross-sectional view along an A-A' line shown in FIG. 8. The light-emitting device 500 has the similar structure with the fourth embodiment of the light-emitting device 400. The difference is that the second semiconductor layer 14 has a pattern substantially the same as the pattern of the ohmic contact layer 15 in the present embodiment. As shown in FIG. 8 and FIG. 12, the ohmic contact layer 15 and the second semiconductor layer 14 each are annular according to the fifth embodiment, and the outer segment 162 is directly in contact with the first semiconductor layer 30, specifically, is directly in contact with the first region 302 of the first semiconductor layer 30. The first electrode 16 is directly in contact with the ohmic contact layer 15 and the first semiconductor layer 30 both. More specifically, the outer segment 162 of the first electrode 16 is directly in contact with the first semiconductor layer 30, and the inner segment 161 of the first electrode 16 is directly in contact with ohmic contact layer 15. In the present embodiment, the first semiconductor layer 30 comprises a Group III-V semiconductor material comprising a content of Al, wherein the content of Al is less than a content of Al in the second-type conductivity semiconductor layer 133 so as to or decrease the formation of byproduct such as native oxide; thus improving the adhesion between the first semiconductor layer 30 and the outer segment 162. Preferably, the first semiconductor layer 30 comprises $(Al_yGa_{(1-y)})_{1-x}In_xP$, wherein $0 \le x \le 1$, $0 \le y \le 0.3$ or $Al_xGa_{(1-x)}As$, wherein $0 \le x \le 0.3$, for improving the adhesion between the first semiconductor layer 30 and the outer segment 162.

In the present embodiment, the doping concentration of the dopant of the second semiconductor layer 14 is not limited to be not greater than $1 \times 10^{18}/cm^3$. In accordance with a further embodiment of the present disclosure, the structures in the embodiments of the present disclosure can be combined or changed. For example, the light-emitting device as shown in FIGS. 5A and 5B comprises the first semiconductor layer 30, second semiconductor layer 14 and/or the third semiconductor layer 31.

The foregoing description has been directed to the specific embodiments of this invention. It will be apparent to those having ordinary skill in the art that the foregoing embodiments alone or combinations thereof shall be a part of the present disclosure, and other alternatives and modifications can be made to the devices in accordance with the present disclosure without departing from the scope or spirit of the disclosure. In view of the foregoing, it is intended that the present disclosure covers combinations, modifications and variations of this disclosure provided they fall within the scope of the following claims and their equivalents.

What is claimed is:

1. An light-emitting device, comprising:
a light-emitting stack;
a first semiconductor layer on the light-emitting stack;
a first electrode formed on the first semiconductor layer and comprising an inner segment, an outer segment, and a plurality of extending segments electrically connecting the inner segment with the outer segment.

2. The light-emitting device of claim 1, further comprising a second semiconductor layer between the first semiconductor layer and the first electrode, wherein the second semiconductor layer has a thickness less than a maximum thickness of the first semiconductor layer.

3. The light-emitting device of claim 2, wherein the first electrode is directly in contact with the second semiconductor layer.

4. The light-emitting device of claim 3, wherein the second semiconductor layer comprises a Group III-V semiconductor material devoid of Al.

5. The light-emitting device of claim 3, wherein the outer segment of the first electrode is directly in contact with the second semiconductor layer.

6. The light-emitting device of claim 5, wherein the second semiconductor layer has a doping concentration of a dopant not greater than $1 \times 10^{18}/cm^3$.

7. The light-emitting device of claim 2, further comprising an ohmic contact layer between the second semiconductor layer and the first electrode.

8. The light-emitting device of claim 7, wherein the second semiconductor layer and the ohmic contact layer each have a doping concentration, and a ratio of the doping concentration of the ohmic contact layer to the doping concentration of the second semiconductor layer is not less than 2.

9. The light-emitting device of claim 7, wherein the first electrode is directly in contact with the first semiconductor layer.

10. The light-emitting device of claim 9, wherein the outer segment of the first electrode is directly in contact with the first semiconductor layer.

11. The light-emitting device of claim 10, wherein the inner segment of the first electrode is directly in contact with the ohmic contact layer.

12. The light-emitting device of claim 9, wherein the light-emitting stack comprises a first-type conductivity semiconductor layer, a second-type conductivity semiconductor layer, and an active layer sandwiched between the first-type and second-type conductivity semiconductor layers, the first semiconductor layer is between the second-type conductivity semiconductor layer and the first electrode, and the first semiconductor layer and the second-type conductivity semiconductor layer each comprises a Group III-V semiconductor material comprising a content of Al, wherein the content of Al of the first semiconductor layer is less than the content of Al of the second-type conductivity semiconductor layer.

13. The light-emitting device of claim 9, wherein the first semiconductor layer comprises $(Al_yGa_{(1-y)})_{1-x}In_xP$, wherein $0 \le x \le 1$, $0 \le y \le 0.3$ or $Al_zGa_{(1-z)}As$, wherein $0 \le z \le 0.3$.

14. The light-emitting device of claim 2, wherein the second semiconductor layer comprises an outer edge, and the outer edge and a side wall of the first semiconductor layer are substantially coplanar.

15. The light-emitting device of claim 1, further comprising a light-absorbing layer on the first semiconductor layer, wherein the first semiconductor layer has a side wall, and the light-absorbing layer covers the side wall.

16. The light-emitting device of claim 15, further comprising a reflective layer under the light-emitting stack.

17. The light-emitting device of claim 16, wherein in a cross-sectional view of the light-emitting device, the reflective layer is not vertically overlapped with the light-absorbing layer.

18. The light-emitting device of claim 15, wherein the first electrode comprises metal or metal alloy.

19. The light-emitting device of claim 18, wherein the light-absorbing layer comprises titanium (Ti), chromium (Cr), nickels (Ni), Au, or combinations thereof.

20. The light-emitting device of claim 15, wherein the first semiconductor layer comprises a top surface comprising a first region and a second region, the light-absorbing layer is on the first region and does not cover the second region, and a part of the second region is roughened.

* * * * *